United States Patent [19]

Fischer

[11] Patent Number: 4,839,599

[45] Date of Patent: Jun. 13, 1989

[54] MULTIPIECE CABLE TESTING DEVICE WHICH FUNCTIONS AS FLASHLIGHT, CONTINUITY CHECKER, AND CABLE IDENTIFIER

[76] Inventor: Montie R. Fischer, 1401 S. Nicolet Rd., Apt. 49, Appleton, Wis. 54915

[21] Appl. No.: 222,813

[22] Filed: Jul. 22, 1988

[51] Int. Cl.⁴ .................. G01R 19/00; G01R 31/02
[52] U.S. Cl. ........................... 324/542; 324/66; 324/506; 324/539
[58] Field of Search ............... 324/66, 506, 539, 542, 324/543, 556

[56] References Cited

U.S. PATENT DOCUMENTS

| | | | |
|---|---|---|---|
| 2,575,821 | 11/1951 | Linton | 324/556 |
| 2,616,952 | 11/1952 | Lauder | 324/506 |
| 3,046,476 | 7/1962 | McFarland | 324/506 |
| 3,519,921 | 7/1970 | Hetzler | 324/556 |
| 3,634,680 | 1/1972 | Myrah | 324/506 |
| 3,775,677 | 11/1973 | Garrett et al. | 324/506 |

*Primary Examiner*—Reinhard J. Eisenzopf
*Assistant Examiner*—Anthony L. Miele

*Attorney, Agent, or Firm*—Michael E. Whitham; C. Lamont Whitham

[57] ABSTRACT

A coaxial cable testing device has a modular construction wherein the several pieces may be configured in different arrangements to fulfill the separate functions of a flashlight, a continuity checker, a cable identifier, and a bandit splitter detector. The pieces are provided with connector elements which allow each of the pieces to fit together and the pieces are small enough to conveniently fit in the shirt pocket of a cable television technician. In the flashlight configuration, a battery pack (10) and a flexible flashlight assembly (18) are interconnected. In the continuity checker or cable identifier configuration, the battery pack (10) is connected to one end of a cable (28) and the detector section (24) and shorting plug (26) are connected to the other end of the cable (28). In the bandit splitter detector configuration, the battery pack (10) is connected to the detector section (24) which is connected to the cable (28). An LED (32) provides visual signals to the technician when continuity is determined or bandit splitters are detected.

4 Claims, 1 Drawing Sheet

U.S. Patent   Jun. 13, 1989   4,839,599
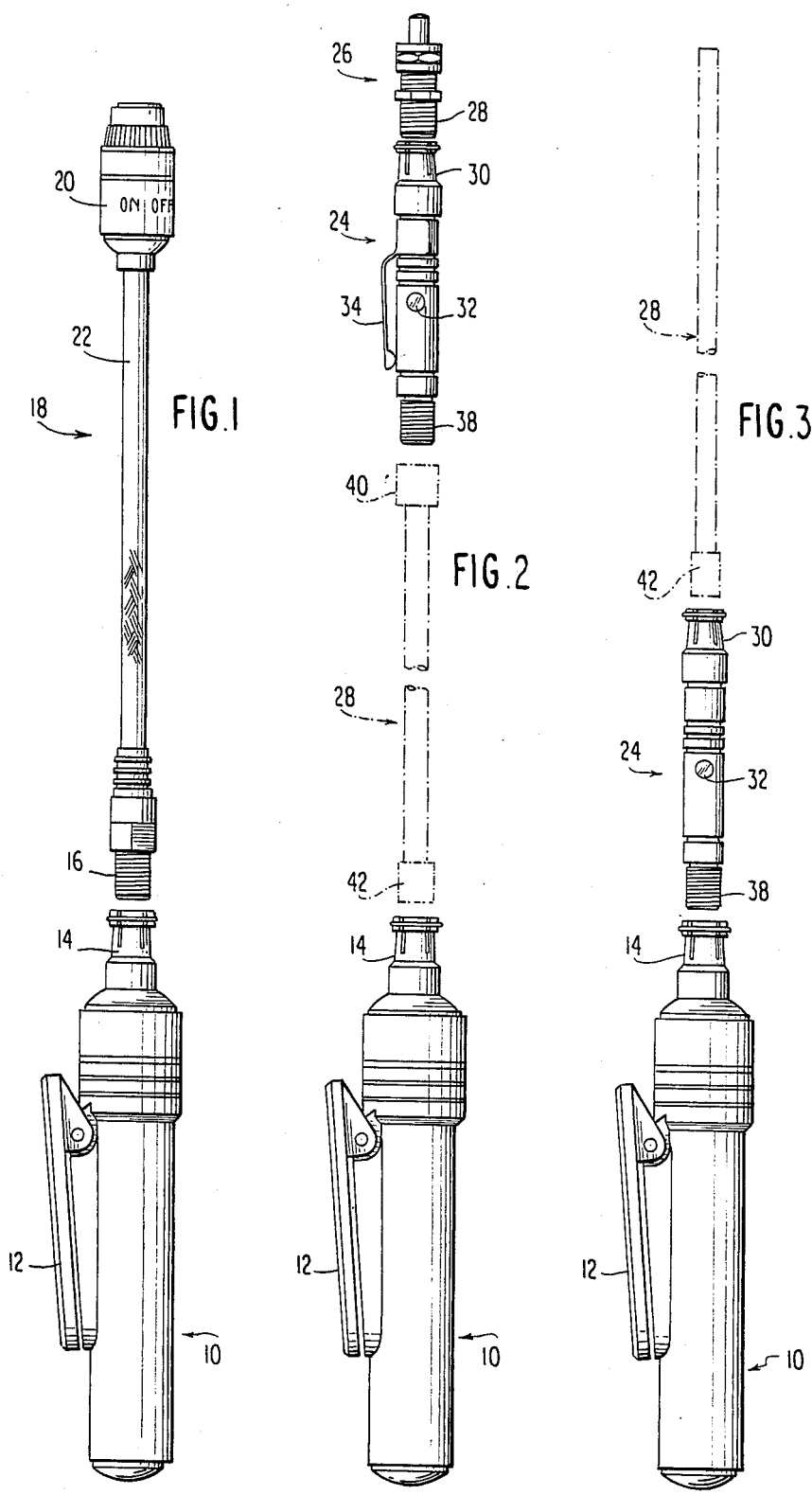

MULTIPIECE CABLE TESTING DEVICE WHICH FUNCTIONS AS FLASHLIGHT, CONTINUITY CHECKER, AND CABLE IDENTIFIER

BACKGROUND OF THE INVENTION

1. Field of the Invention

The subject invention is generally related to a coaxial cable testing device of modular construction which is capable of both checking cable electrical continuity and detecting unauthorized or "bandit" splitters, and more particularly, for a coaxial cable testing device of modular construction which is configured in one arrangement for checking cable electrical continuity and is reconfigured to another arrangement for detecting bandit splitters.

2. Description of the Prior Art

In recent years, many households have begun subscribing to pay cable television (CATV) as a source of viewing entertainment. Pay television channel signals are generally supplied via coaxial cable transmission lines to the subscriber's home. Cables are routinely checked for electrical continuity during the installation process and in trouble shooting an installed system. Subscription rates are based on the type of service, i.e., number and kind (movie, commercial broadcast, special interest, etc.) of channels, and the number of television receivers connected to the cable system. Cable television suppliers need security for their cable lines; therefore, a need exists for cable television suppliers to detect unauthorized interception of cable television signals. Unauthorized interception usually occurs when a bandit splitter has been illegally installed to allow a cable to one site to service two or more sites or service two or more receivers at the same site. Currently, bandit splitters are detected by technicians examining the site locations while on service calls; however, clever hiding of a bandit splitter generally will allow avoiding detection.

U.S. Pat. No. 4,074,187 to Miller et al discloses a cable tester for multi-pair shielded cables which is capable of detecting the continuity of a pair of wires in the cable and shorts between pairs of wires or a wire and a grounding shield within the cable. A first module is connected to the pairs of wires at one end of the cable and a second module is connected to the pairs of wires at the other end. The first module includes a battery, a termination, and a plurality of light emitting diodes (LEDs). Circuitry is arranged such that a technician is given a visual indication when faults are present in the cable. The second module includes a termination and LEDs. The LEDs in the second module aid in the determination of pairs of wires within the cable and indicate the polarity of a pair of wires. The invention is used primarily for trouble shooting cash register systems in large department stores and is not applicable to testing coaxial cable. Moreover, in order to conduct all the tests it is necessary that the cable be connected at both ends to the two modules.

U.S. Pat. No. 4,293,376 to Bartol discloses a probe for sensing characteristics of electrical devices utilizing a magnetic switch sensor. The probe allows a technician to quickly determine if a relay or solenoid has been energized. When the probe is placed within a magnetic field, the reeds of a reed switch close to complete a circuit. Current from a storage battery within the probe may then flow through a lamp to give a visual indication of the solenoid's status. The probe is a small unit which can easily be carried by a technician.

U.S. Pat. No. 4,366,434 to Ellis discloses a combined voltage detector and electrical continuity checker which has a pencil like configuration. The testing device includes an insulation piercing needle, three LEDs, and two socket connections for connecting a flexible insulated cable that has an alligator clip at on end. Depending on the test to be performed, the flexible cable is placed in a particular socket and the needle is used to pierce the insulation to a conductor in a cable while the alligator clip is connected to ground. The LEDs provide a visual indication of the results of the testing.

None of the patents in the prior art disclose a cable testing device which allows a technician to check for cable continuity in a coaxial cable and to detect bandit splitters. None of the patents in the prior art show a cable testing device of modular construction wherein a technician can configure the several pieces in different arrangements for performing different tests.

SUMMARY OF THE INVENTION

It is therefore an object of this invention to provide a cable testing device of modular construction which can be used to check cable continuity and can be used to detect bandit splitters.

It is another object of this invention to provide a coaxial cable testing device which is small enough to be carried in the shirt pocket of a technician.

It is a further object of the invention to provide a battery powered cable testing device which may also function as a small flashlight.

According to the invention, a coaxial cable testing device of modular construction includes a battery pack, a detector section with an LED indicator, and a shorting plug. The battery pack and detector section are equipped with suitable connectors which allow the detector section to be connected to the battery pack and allow the shorting plug to be connected to the detector section. In addition, a lamp may be connected to the battery section to form a flashlight. All of the pieces fit conveniently in the shirt pocket of a cable television technician.

When checking cable electrical continuity, the battery pack is placed at one end of a coaxial cable and the detector section is placed at the other end of the cable. Coaxial adapters may be attached to the cable ends in order to electrically connect the cable to the battery pack and detector section. During this check, the shorting plug is mechanically and electrically connected to the detector section. The shorting plug provides a return path for the DC current. Continuity is visually signalled to the technician by the LED in the detector section lighting up. An LED indicator light is an improvement over incandescent bulbs because the relatively lower current requirements of an LED permits longer lengths of cable to be tested. In addition to providing a continuity check, the arrangement of a battery pack at one end of one of a plurality of coaxial cables and a detector section at the other end of the cables allows the technician to easily distinguish amongst a plurality of cables. By connecting the battery pack to the cable which he will be using, the technician can then identify that cable at another location by simply placing the detector section on each of a plurality of cable ends at that location. The technician has the right cable when the LED lights up.

When detecting bandit splitters, only the LED detector section and battery pack are required. The detector section is mechanically and electrically connected at one end to the battery pack and an end of the coaxial cable under test is electrically connected to the other end of the detector section. A coaxial adapter may be placed on the end of the cable in order to make an electrical connection to the detector section. A bandit splitter will behave like a short in the cable; therefore, if a splitter is present in the cable under test, the splitter provides a return path for the DC current, thereby lighting up the LED in the detector section. Because the technician can electrically detect the presence of a bandit splitter, the unauthorized party will be unable to hide the splitter from the technician.

BRIEF DESCRIPTION OF THE DRAWINGS

The foregoing and other objects, aspects and advantages of the invention will be better understood from the following detailed description of the preferred embodiments of the invention with reference to the accompanying drawings, in which:

FIG. 1 is a side view of a battery pack and flexible lamp attachment;

FIG. 2 is a side view of a battery pack, detector section, and shorting plug with the pieces arranged for checking the electrical continuity of a coaxial cable which is positioned between the battery pack and detector section; and FIG. 3 is a side view of a battery pack and detector section with the pieces arranged for detecting bandit splitters in a coaxial cable.

DETAILED DESCRIPTION OF THE PREFERRED EMBODIMENTS OF THE INVENTION

Referring now to the drawings and, more particularly to FIG. 1, a battery pack 10 has a clip fastener 12 and a male BNC connector 14. The battery pack 10 may be a lightweight plastic tube holding standard AA batteries therein. The clip fastener 12 allows the battery pack to be clipped to a shirt pocket. The male BNC connector 14 may be connected to a female BNC connector 16 of a flexible flashlight attachment 18 which comprises a lighting assembly 20 and a flexible section 22. The lighting assembly 20 is a commercially available unit with an integral on-off rotary switch and an incandescent bulb and lens. Battery power from the battery pack 10 is used to light the assembly 20. Flashlights are valuable tools for cable television technicians because much of their work is performed in dimmly lighted environments. In addition, with the battery pack clipped in the technician's shirt pocket, the flexible section 22 can be adjusted to position the light where required to allow hands free illumination.

FIG. 2 shows a detector section 24 and a shorting plug 26 positioned at one end of a length of cable 28 and the battery pack 10 positioned at the other end. The detector section 24 may be a lightweight metal tube which includes a male BNC connector 30 at one end and a female BNC connector 38 at the other end with coaxial wiring to a signalling device in the form of LED 32. The shorting plug 26 can be a small metal piece. A female BNC connector 28 on the shorting plug 26 mates with the male BNC connector 30 on the detector section 24. The LED 32 provides visual signals to the technician. A clip 34 allows the detector section to be fastened inside the technicians shirt pocket. When the detector section 24 is carried in a pocket, the shorting plug 26 is connected to the detector section 24 to form a single unit.

When testing cable continuity, the male BNC connector 14 of the battery pack 10 is connected to one end of the cable 28, the female BNC connector 38 of the detector section 24 is connected to the other end of cable 28, and the shorting plug 26 is connected to detector section 24 via connectors 28 and 30. The shorting plug 26 provides a return path for DC current. If continuity exists, the LED 32 will light up. Coaxial adapters 40 and 42 may be fastened to the cable 28 to aid in mechanically and electrically connecting the battery pack 10 and detector section 24 to cable 28.

This arrangement may also be used to simply identify a particular cable 28 from a plurality of other cables at a remote location. The technician simply connects the battery pack 10 to one end of a cable 28 which he wants and then connects the combination detector section 24 and shorting plug 26 arrangement to each of the cable ends at the remote location. When the detector section 24 is connected to the correct cable 28, the LED 32 will light up.

FIG. 3 shows the arrangement used when testing for bandit splitters. The battery pack 10 and detector section 24 are connected at male and female BNC connectors 14 and 38, respectively, and the male BNC connector 30 of the detector section 24 is connected to the cable 28. The cable 28 may be fitted with an adapter 42 which promotes mechanical and electrical connection of the cable. If a bandit splitter (not shown) is present anywhere along the length of the cable 28, it will behave like a short and will provide a return current path. The bandit splitter will thus form a closed circuit which will cause the LED 32 to light up signalling its presence to the technician.

While the invention has been described in terms of the preferred embodiment which contemplates a modular cable testing apparatus having four pieces that can be alternatively configured to fulfill the separate functions of a flashlight, cable continuity tester, cable identifier, and bandit splitter detector, those skilled in the art will recognize that the practice of the invention can be varied within the spirit and scope of the appended claims.

Having thus described my invention, what I claim as novel and desire to secure by Letters Patent is the following:

1. A modular cable testing device, comprising:

a battery pack, said battery pack including a first connecting means;

a detector section for determining cable continuity, identifying one cable from a plurality of cables, or detecting electrical shorts in a cable, said detector section including a visual signalling means for signalling a cable is continuous, a particular cable is identified, or an electrical short is present in a cable, said detector section including a second connecting means and a third connecting means;

a shorting plug providing a return path for electrical current, said shorting plug including a fourth connecting means;

said first connecting means being connectable to a first end of a cable or to said second connecting means of said detector section;

said second connecting means being connectable to a second end of a cable or to said first connecting means of said battery pack; and said third connecting means being connectable to an end of a cable or to said fourth connecting means of said shorting plug.

2. A modular cable testing device as recited in claim 1 wherein said battery pack has a first fastening clip, said first fastening clip being used to secure said battery pack to a shirt pocket, said detector section has a second fastening clip, said second fastening clip being used to secure said detector section to said shirt pocket.

3. A modular cable testing device as recited in claim 1 further comprising a flexible flashlight attachment having a fifth connecting means, said fifth connecting means being connectable to said first connecting means of said battery pack.

4. A modular cable testing device as recited in claim 1 wherein said visual signal means comprises a light emitting diode.

* * * * *